United States Patent
Stolpman et al.

(10) Patent No.: US 8,022,777 B2
(45) Date of Patent: Sep. 20, 2011

(54) OVENIZED CRYSTAL OSCILLATOR ASSEMBLY

(75) Inventors: James L. Stolpman, Bloomingdale, IL (US); Jeffrey A. McCracken, Sugar Grove, IL (US)

(73) Assignee: CTS Corporation, Elkhart, IN (US)

( * ) Notice: Subject to any disclaimer, the term of this patent is extended or adjusted under 35 U.S.C. 154(b) by 165 days.

(21) Appl. No.: 12/380,313

(22) Filed: Feb. 26, 2009

(65) Prior Publication Data

US 2009/0219101 A1    Sep. 3, 2009

Related U.S. Application Data

(60) Provisional application No. 61/067,630, filed on Feb. 28, 2008, provisional application No. 61/128,525, filed on May 22, 2008.

(51) Int. Cl.
*H03L 1/04* (2006.01)

(52) U.S. Cl. ............... 331/70; 331/65; 331/66; 331/68; 331/69; 331/116 FE; 331/116 R; 331/116 M; 331/154; 331/158

(58) Field of Classification Search ............... 331/65, 331/66, 68, 69, 70, 116 FE, 116 R, 116 M, 331/154, 158
See application file for complete search history.

(56) References Cited

U.S. PATENT DOCUMENTS

| | | | |
|---|---|---|---|
| 4,750,246 A * | 6/1988 | Pollard | 29/25.35 |
| 5,180,942 A | 1/1993 | Marvin et al. | |
| 5,438,219 A | 8/1995 | Kotzan et al. | |
| 5,917,272 A | 6/1999 | Clark et al. | |
| 5,920,146 A | 7/1999 | Carroll et al. | |
| 6,060,692 A | 5/2000 | Bartley et al. | |
| 6,133,674 A | 10/2000 | Fry | |
| 6,147,565 A * | 11/2000 | Satoh et al. | 331/70 |
| 6,229,249 B1 | 5/2001 | Hatanaka et al. | |
| 6,229,404 B1 | 5/2001 | Hatanaka | |
| 6,501,340 B1 | 12/2002 | Flood | |
| 6,608,531 B2 * | 8/2003 | Stolpman et al. | 331/176 |
| 6,664,864 B2 | 12/2003 | Jiles et al. | |
| 6,870,430 B2 | 3/2005 | Nakamura et al. | |
| 7,253,694 B2 | 8/2007 | Hardy et al. | |
| 2005/0082377 A1 | 4/2005 | Kato et al. | |
| 2005/0258913 A1 * | 11/2005 | Ito et al. | 331/158 |
| 2006/0012446 A1 | 1/2006 | Hardy et al. | |
| 2008/0061899 A1 | 3/2008 | Stolpman | |

FOREIGN PATENT DOCUMENTS

| | | |
|---|---|---|
| JP | 56-117404 | 9/1981 |
| JP | 59-91719 | 5/1984 |
| JP | 6-140871 | 5/1994 |
| WO | WO02/27915 | 4/2002 |

* cited by examiner

*Primary Examiner* — Arnold Kinkead
*Assistant Examiner* — Richard Tan
(74) *Attorney, Agent, or Firm* — Daniel J. Deneufbourg

(57) ABSTRACT

An oscillator assembly including an oscillator seated on a pad of thermally conductive material formed on the surface of a printed circuit board and covered by a lid defining an oven for the oscillator. In one embodiment, a plurality of heaters are located on different sides of the oscillator and at least partially seated on the pad for evenly transferring heat to the pad and the oscillator. In one embodiment, the oscillator is a temperature compensated crystal oscillator and an integrated amplifier controller circuit on the printed circuit board integrates at least one operational amplifier for controlling the heater(s) and one or more transistors for providing heat to the oven. A canopy seated on the pad and covering the oscillator can be used for transferring heat more evenly to the oscillator. A cavity in the bottom of the printed circuit board defines an insulative air pocket.

9 Claims, 4 Drawing Sheets

OVENIZED CRYSTAL OSCILLATOR ASSEMBLY

CROSS REFERENCE TO RELATED APPLICATIONS

This application claims the benefit of the filing date and disclosure of U.S. Provisional Patent Application Ser. No. 61/067,630 filed on Feb. 28, 2008, and U.S. Provisional Patent Application Ser. No. 61/128,525 filed on May 22, 2008, the contents of which are entirely incorporated herein by reference as are all references cited therein.

FIELD OF THE INVENTION

This invention relates to oscillators and, more specifically, to a high performance, reduced size, low cost ovenized crystal oscillator assembly.

BACKGROUND OF THE INVENTION

Oscillators are well known devices for providing a reference frequency source. The oscillator typically has a quartz crystal or other resonator and also has electronic compensation circuitry to stabilize the output frequency.

Various methods are known for stabilizing the output frequency as the temperature of the oscillator changes. Temperature compensated crystal oscillators (TCXO) typically employ thermistors which generate a correction voltage that reduces the frequency variation over temperature. The correction voltage is usually applied to a varactor diode in the crystal circuit such that the crystal frequency may be varied by a small amount.

To obtain a more stable output, ovenized oscillators (OCXO) heat the temperature sensitive portions of the oscillator which are isolated from the ambient to a uniform temperature. Ovenized oscillators contain a heater, a temperature sensor, and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees Centigrade above the highest expected ambient temperature.

Despite the benefits of the oscillators available today, there continues to be a need for high performance, reduced size, low cost ovenized crystal oscillators.

SUMMARY OF THE INVENTION

It is a feature of the invention to provide a low cost, reduced size, high performance ovenized oscillator assembly which, in one embodiment, comprises a temperature compensated crystal oscillator mounted on a printed circuit board, at least one temperature sensor on the printed circuit board which is in proximity to the oscillator, and a lid that covers at least the oscillator and defines an oven for the oscillator.

In one embodiment, the oscillator assembly includes several heaters located on different sides of the oscillator for distributing heat evenly to the oscillator. The heaters and the oscillator may be seated on a pad of thermally conductive material which is formed on the printed circuit board and heat is transferred to the oscillator through the pad.

In a preferred embodiment of the oscillator assembly of the present invention, an integrated controller circuit on the printed circuit board is used to control the heaters in response to changes in temperature inside the oven. In accordance with the invention, the integrated controller circuit integrates at least one operational amplifier and additional devices, such as transistors, for providing sufficient power and/or heat to the oven. The integrated controller circuit may also be seated on the pad for transferring heat generated by the integrated controller circuit to the oscillator.

In one embodiment, a canopy is seated on the pad and covers the oscillator and the heaters transfer heat to the canopy which, in turn, transfers heat to the oscillator.

In a further embodiment, a recess or cavity in the bottom of the printed circuit board defines an insulative pocket for air or the like insulative medium.

Other advantages and features of the present invention will be more readily apparent from the following detailed description of the embodiments of the invention, the accompanying drawings, and the appended claims.

BRIEF DESCRIPTION OF THE DRAWINGS

These and other features of the invention can best be understood by the following description of the accompanying drawings as follows.

DETAILED DESCRIPTION

Figure 1:
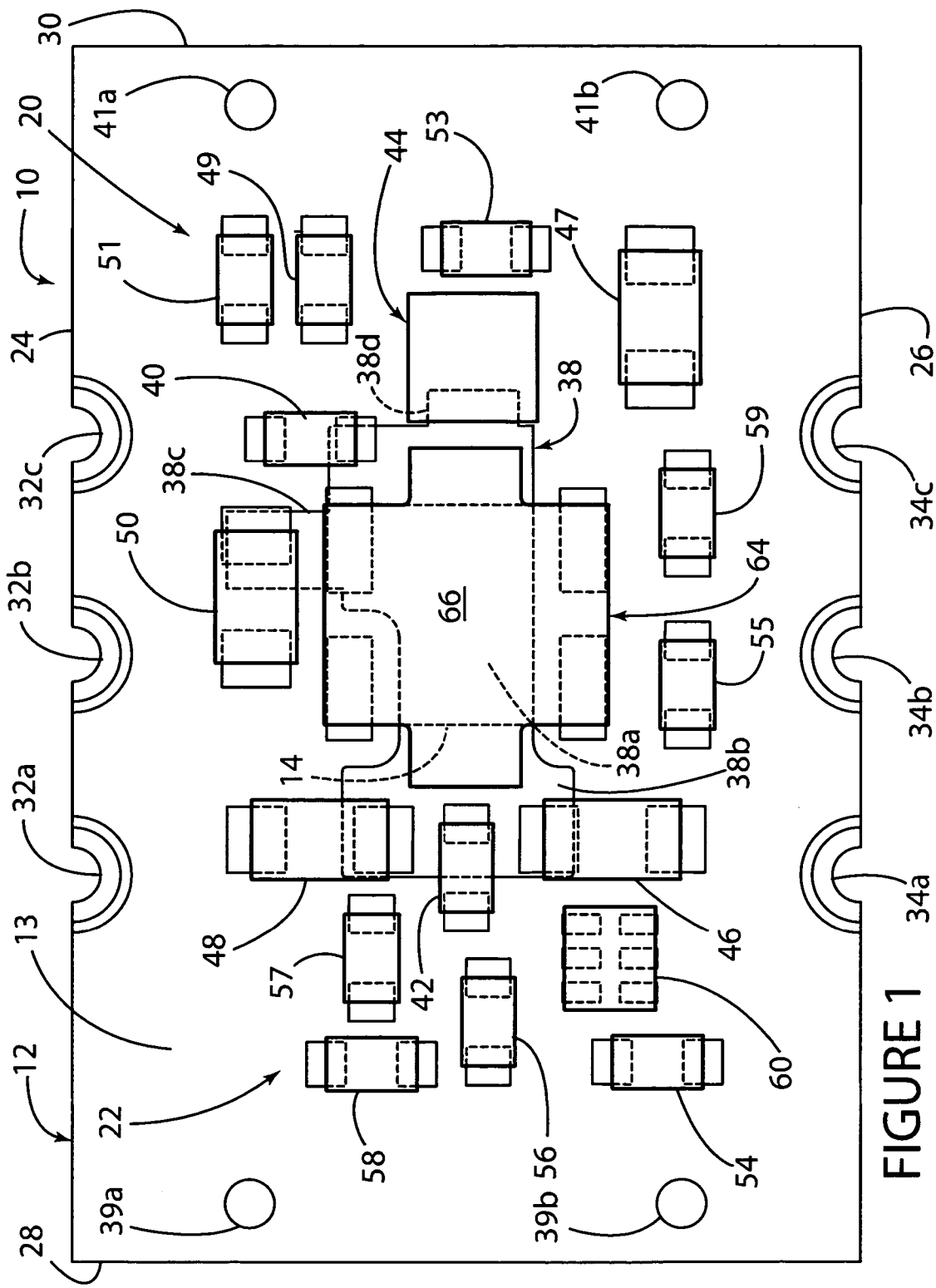
FIG. 1 is an enlarged simplified top plan view of the printed circuit board of an ovenized crystal oscillator assembly in accordance with the present invention with the lid removed therefrom.
Figure 2:
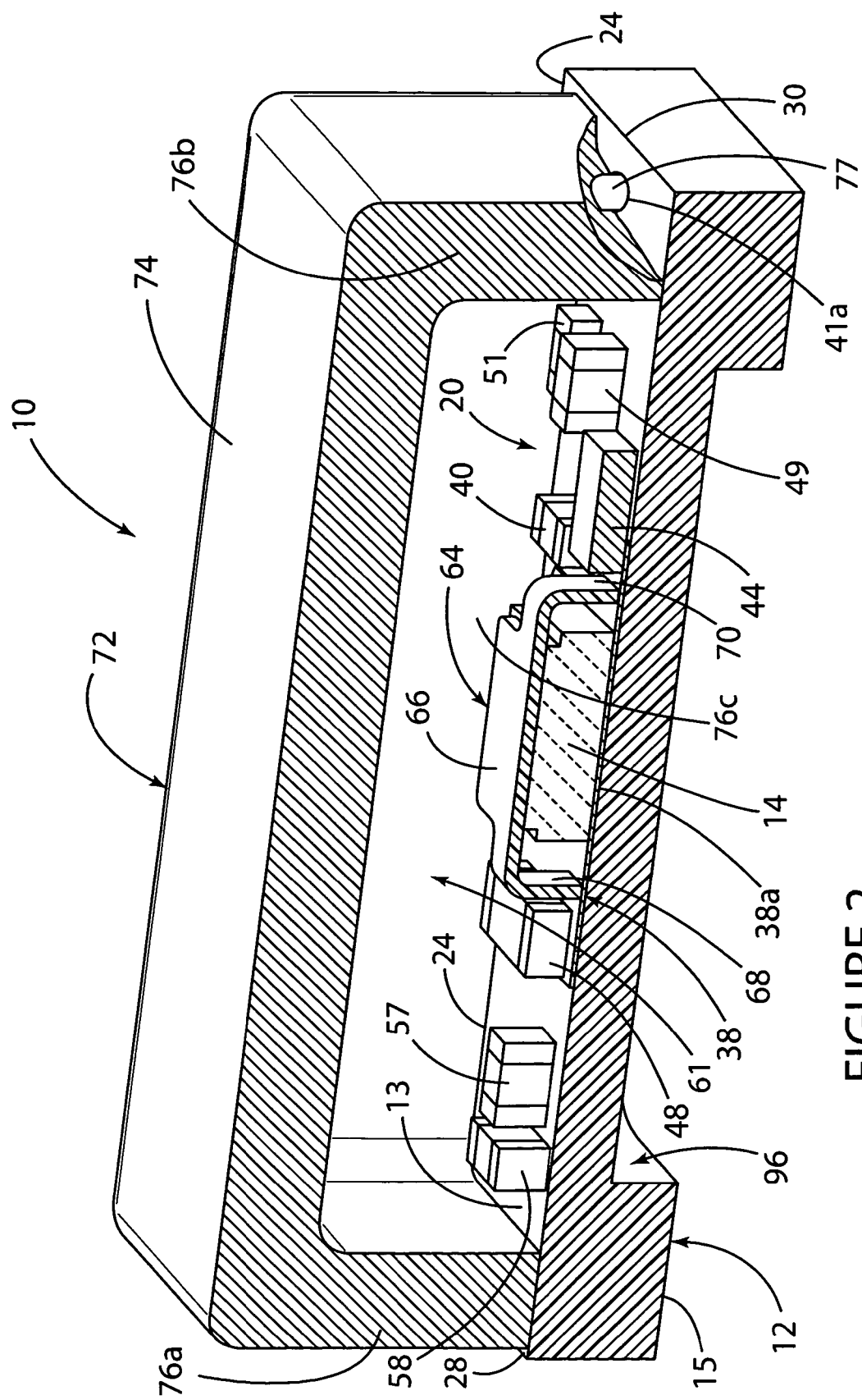
FIG. 2 is an enlarged simplified part perspective, part vertical cross-sectional view of the oscillator assembly of the present invention.
Figure 3:
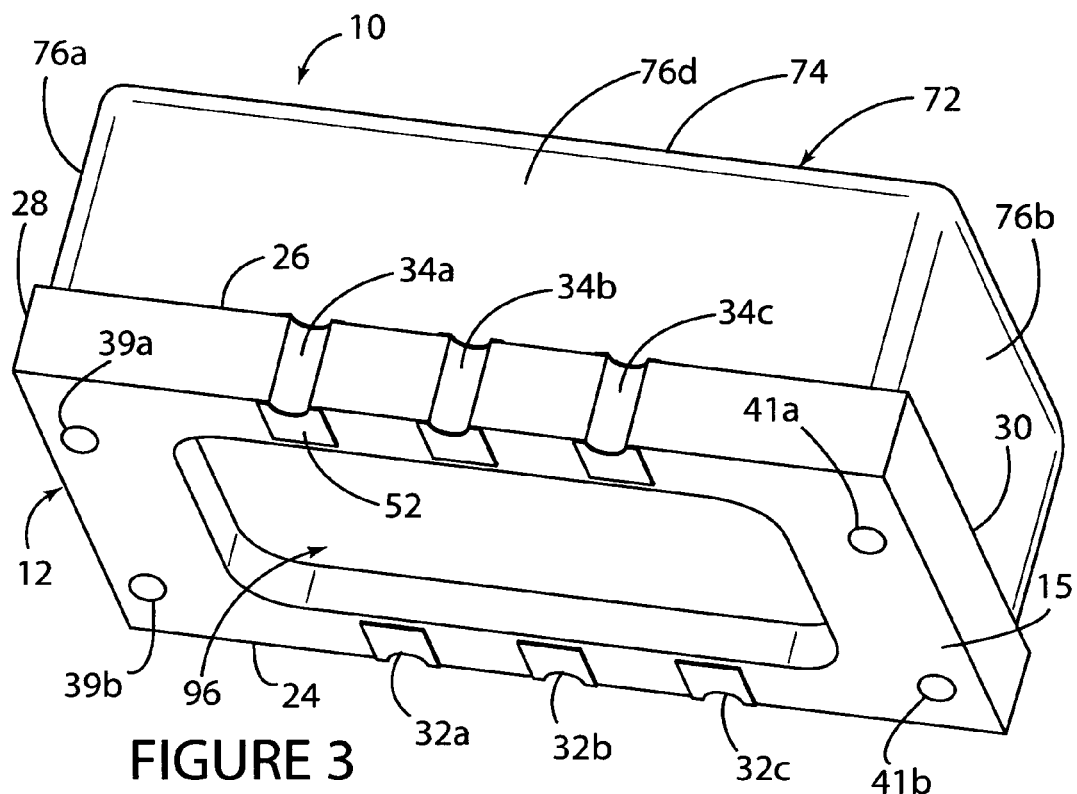
FIG. 3 is an enlarged, simplified bottom perspective view of the oscillator assembly of FIG. 2.

One embodiment of an ovenized crystal oscillator assembly 10 in accordance with the present invention is shown in FIGS. 1-3. The operating range of oscillator assembly 10 is preferably between about −5° C. to 70° C. Supply voltage is preferably between 2.4 and 5.5 Vdc.

Ovenized crystal oscillator assembly 10 initially comprises a substrate in the form of a printed circuit board (PCB) 12 of standard glass epoxy laminate, multi-layer construction on which at least the following electrical/electronic components/circuits have been mounted to and/or defined on the top surface 13 thereof: a crystal oscillator 14 which, in the embodiment shown, is a TCXO (temperature compensated crystal oscillator); an oven control and heating circuit 20 (FIG. 1) including, in part, an integrated amplifier controller circuit 44 and heater elements 46, 48, and 50; and a waveform buffer circuit 22 (FIG. 1).

In the embodiment shown, printed circuit board 12 is about 9 mm wide and 14 mm long and defines a pair of opposed, parallel upper/top and lower/bottom horizontal long side edges 24 and 26 and a pair of opposed, parallel, vertical short side edges 28 and 30. The top long side edge 24 defines three spaced-apart, parallel semi-circular castellations 32a, 32b, 32c extending between the top and bottom surfaces 13 and 15 (FIG. 2) of printed circuit board 12. The bottom long side edge 26 defines three spaced-apart, parallel, semi-circular castellations 34a, 34b, 34c which are diametrically opposed to the top castellations 32a, 32b, and 32c respectively.

Each of the castellations is defined by a generally semi-circularly-shaped elongate groove which is formed in the respective side edges; extends between the top and bottom surfaces 13 and 15 of printed circuit board 12 in an orientation generally normal thereto; and is covered/coated with a layer of conductive material, such as copper or the like, to define a path for electrical signals between at least the top and bottom surfaces 13 and 15 of printed circuit board 12.

In the embodiment of FIGS. 1-3, the castellations define respective pads 52 (FIG. 3) on the bottom surface 15 of printed circuit board 12 defining surface connections to a motherboard (not shown) including supply voltage, control voltage, ground, and output connections.

In accordance with the present invention, at least a first strip or layer or pad of conventional thermally conductive, heat transferring material 38 (FIGS. 1 and 3), such as copper or the like, is formed on the top surface 13 of printed circuit board 12. The pad of conductive material 38 is generally centrally located on the top surface 13 of the printed circuit board 12.

Although not described or shown herein in any detail, it is understood that printed circuit board 12 includes several additional strips of conductive material formed and located on the top board surface 13 and adapted to electrically connect the various elements on the printed circuit board 12 to each other and/or to the pad 38 and/or the castellations and/or appropriate vias extending through the core of printed circuit board 12 as known in the art.

In accordance with the invention, oscillator 14 is located and mounted generally centrally on the top surface 13 of printed circuit board 12 in a relationship overlying and seated on at least a central portion 38a of conductive pad 38. Oscillator 14 is preferably placed centrally on the board surface 13 to provide optimum isolation from changes in ambient temperature. In accordance with the present invention, oscillator 14 can be a standard 3.2×5 mm or 3.2×2.5 mm package TCXO of the Pierce and AT-cut quartz crystal type.

A temperature sensing element 40 which, in the embodiment shown, is in the form of a negative coefficient conventional thermistor, is located on the board surface 13 above and opposite the right hand corner of oscillator 14. One of the ends of thermistor 40 is seated on a right side upper edge of pad 38.

A second optional temperature sensor element 42, which is also preferably a negative coefficient conventional thermistor, is located on the board surface 13 opposite the left side edge of oscillator 14. One of the ends of thermistor 42 is seated on a left side peripheral wing portion or edge 38b of pad 38. In accordance with the invention, thermistors 40 and 42 are positioned on separate halves or regions of the printed circuit board 12 in a generally opposed relationship on opposite sides of the oscillator 14 and, in operation, are preferably set to be closely coupled to the temperature of the crystal of oscillator 14.

The use of two thermistors located on opposite sides of the oscillator 14 and printed circuit board 12 as in the present invention provides the benefit of allowing the oscillator assembly 10 to be mounted or used in any orientation including, for example, side edge 28 up or side edge 30 up with minimum effect on the oscillator temperature since the thermistors 40 and 42 are coupled together to provide a temperature signal which is the average of the oven temperatures sensed by thermistors 40 and 42 in the two different regions of oscillator assembly 10.

Sensors 40 and 42 are connected to the oven control and heating circuit 20 and, more specifically, to the integrated amplifier controller circuit 44 which, in turn, is connected to and controls the plurality of heater elements 46, 48, and 50.

Integrated amplifier controller circuit 44 receives a temperature signal as an input from sensors 40 and 42 and provides a heater control signal as an output. When the temperature in the oven 61 (FIG. 2), defined by the interior space bounded by the interior face of the walls and roof of the lid/cover 72 and the top surface of the printed circuit board 12 falls below a selected value, the integrated amplifier controller circuit 44 increases power to the heater elements 46, 48, and 50 to increase the temperature inside the oven 61. When the temperature in the oven 61 increases above a selected value, integrated amplifier controller circuit 44 reduces power to the heater elements 46, 48, and 50 to allow a decrease in the temperature inside the oven 61.

In accordance with the present invention, integrated amplifier controller circuit 44 is preferably an integrated circuit (IC) type amplifier adapted to be mounted to the printed circuit board 12, which due to board space limitations, measures only about 2.25 square mm. Controller 44 advantageously integrates at least one operational amplifier and additional elements including transistor(s) adapted and designed to provide sufficient output power and/or heat for the oven.

Integrated amplifier controller circuit 44 additionally incorporates and integrates additional resistors adapted to set the reference for the operational amplifier integrated thereon; a current limiting circuit adapted to limit the excessive power dissipation in the load when a short-circuit occurs; and a thermal overload circuit which allows the internal amplifiers to be switched off when the temperature exceeds a first set temperature and to switch back on only when the temperature decreases to a second set temperature below the first set temperature.

In accordance with the present invention, the plurality of heater/heating elements 46, 48, and 50 (which can take the form of heater resistors) are located on the board surface 13 in a relationship generally surrounding, and/or on different sides of, the oscillator 14 to provide a more evenly distributed balanced heating of the oscillator 14 as described in more detail below.

More specifically, heater element 46 is located below and spaced from the lower left edge corner of oscillator 14 and includes one end seated on a lower peripheral left side edge of wing extension 38b of conductive pad 38. Heater element 48 is located above and spaced from the upper left corner of oscillator 14 and includes one end seated on an upper peripheral left side edge of wing extension 38b of conductive pad 38. Heater element 50 is located centrally above and spaced from the upper edge of oscillator 14 and also includes one end seated on an upper peripheral edge of a wing extension 38c of the conductive pad 38.

In the embodiment shown, amplifier controller circuit 44 is located on the right half of the printed circuit board 12 to the right of and spaced from the oscillator 14 and likewise defines a heater element which includes one end seated on a right side peripheral edge or wing extension 38d of conductive pad 38.

Elements 47, 49, 51, and 53 comprise resistors and/or capacitors forming part of the oven control and heating circuit 20. In the embodiment shown, elements 47, 49, 51, and 53 together with integrated amplifier controller circuit 44 are located on the right side half of the printed circuit board 12 between the oscillator 14 and board right side edge 30. The particular application and desired performance of module 10 determines the number, selection, placement, interconnection, and values of the various elements defining the oven control and heating circuit 20.

In the embodiment shown, the elements defining the optional waveform buffer circuit 22 are located generally on the left half portion of the printed circuit board 12 between oscillator 14 and left board side edge 28. Elements 54, 56, 57, and 58 comprise appropriate resistors and/or capacitors and element 60 comprises a buffer integrated circuit, all selected and coupled together to form the buffer circuit 22 which, in turn, is appropriately coupled to oscillator 14. The specific application and desired performance of module 10 determines the number, selection, placement, interconnection, and values of the appropriate resistors, capacitors, and buffer IC of buffer circuit 22.

Elements 55 and 59 located below the oscillator 14 comprise bypass capacitors.

Ovenized oscillator assembly 10 additionally comprises a heat transfer element in the form of a canopy 64 (FIGS. 1 and 2) which is adapted to cover, and provide a more uniform temperature to, the oscillator 14. Canopy 64, which may be made of any suitable conductive material including metal, includes a roof 66 which covers and is seated against the upper surface of oscillator 14 and at least two opposed legs 68 and 70 (FIG. 2) which extend generally normally downwardly from the respective left and right peripheral side edges of the roof 66 and include respective feet seated on respective right and left side edges of the central portion 38a of pad 38 and oscillator 14.

In the embodiment of the invention including canopy 64, a layer of solder material (not shown) is applied between the upper surface of oscillator 14 and the lower surface of roof 66 of canopy 64 during the oscillator assembly process. The solder couples the oscillator 14 to the canopy 64 and serves as a means for the transfer of heat from the canopy 64 to the oscillator 14 as also described in more detail below.

As shown in FIGS. 2 and 3, oscillator assembly 10 further comprises a lid 72 which preferably covers the full top surface 13 of printed circuit board 12. Lid 72 includes a roof 74 and four downwardly depending walls 76a, 76b, 76c, and 76d defining respective lower peripheral end faces or edges seated on the top surface 13 of printed circuit board 12 adjacent respective board peripheral edges 24, 26, 28, and 30. In the embodiment shown, the walls 76a, 76b, 76c, and 76d and roof 74 preferably have a thickness greater than the standard thickness of about 0.2 mm and preferably at least about 1.0 mm.

Each wall 76a and 76b includes a pair of spaced-apart pins (only one pin 77 of which is shown in FIG. 2) extending outwardly from the peripheral end face thereof. Pins 77 are adapted to be fitted into respective spaced-apart through-holes 39a, 39b, 41a and 41b (FIGS. 1 and 3) formed adjacent each of the transverse side edges 28 and 30 of printed circuit board 12. The pins and through-holes in combination allow the lid 72 to be easily located on, and secured to, the top of the printed circuit board 12.

Lid 72 is preferably made from a suitable insulative material such as plastic to keep the oscillator assembly 10 and, more specifically, oscillator 14 in the oven at a constant temperature, thus reducing the assembly's power requirements. The total height of the oscillator module with the lid 72 is about 5.5 mm.

In accordance with the invention, the location of respective heating elements 46, 48, and 50 in an orientation generally surrounding the periphery, and on different sides of, the oscillator 14 and canopy 64 allow the oscillator 14 and canopy 64 to be evenly heated on all sides as described in more detail below.

More specifically, it is understood that the heat generated by the heater resistors 46, 48, and 50 as well as the integrated controller circuit 44 is transferred not only to the air which occupies the oven 61 but also to each of the four peripheral side edges of pad 38 on which at least a portion of each of the elements 44, 46, 48, and 50 is seated and thereafter simultaneously both upwardly into the legs 68 and 70 and roof 66 of canopy 64 and into the central portion 38a of pad 38 located below oscillator 14 to allow the even and distributed heating of all of the sides and top and bottom surfaces of oscillator 14.

The placement of respective thermistors 40 and 42 adjacent opposed or different sides of the oscillator 14 also allows the assembly 10 to be mounted in any orientation with minimum effect on the oven temperature.

Figure 4:
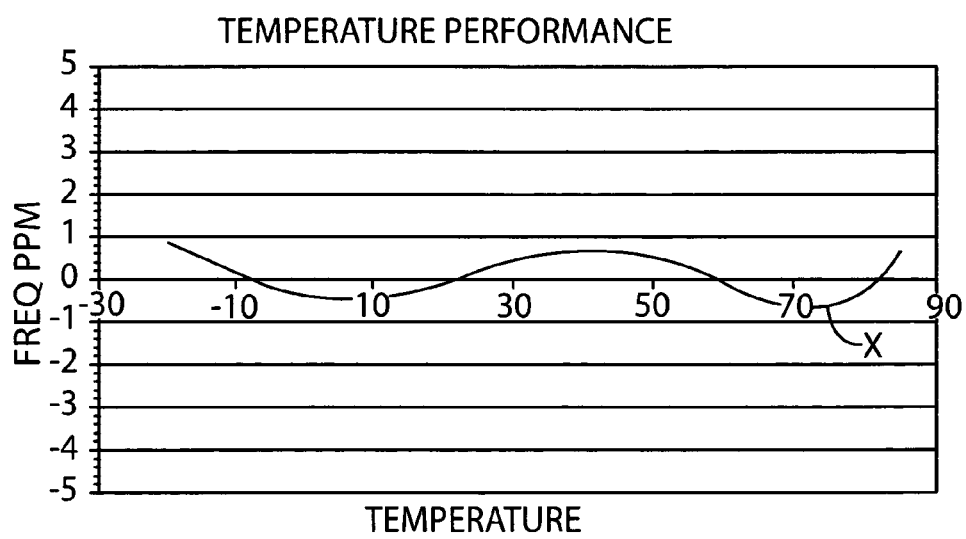
FIG. 4 is a graph of the PPM versus temperature performance characteristics of a standard temperature compensated crystal oscillator.

Still further, in certain embodiments of the present invention, the oven temperature may be set at the turning point temperature of standard off-the-shelf temperature compensated crystal oscillators, i.e., for example, at or near the point generally designated X in FIG. 4 of flat temperature response or area of the lowest or no slope that is above the maximum ambient operating temperature to which assembly 10 is exposed. Thus, assembly 10 operates the TCXO 14 in an area of response which is similar to operating an OCXO oven at the turning point of the crystal.

As shown in FIG. 4 which depicts the compensation performance of a typical TCXO, it is understood that the oven operating temperature of assembly 10 could be set at or near 70° C. and is adapted to provide a reasonably flat response for an oven designed to hold a temperature within a range of ±1.5° C.

Referring back to FIG. 3, another feature of the oscillator assembly 10 of the present invention is the presence of interior vertical walls in the bottom of printed circuit board 12 which define a centrally located recess or cavity or pocket 96 which extends from the bottom surface 15 of printed circuit board 12 into the interior of the body of printed circuit board 12. Recess or cavity or pocket 96 is preferably located in a region of printed circuit board 12 directly beneath the region on the top surface 13 of printed circuit board 12 including pad 38 and heater elements 44, 46, 48, and 50, i.e., the region of printed circuit board 12 which is heated.

In accordance with the present invention, the air which occupies the interior space of printed circuit board 12 defined by cavity or pocket 96 defines an interior board layer or region of insulation between the interior oven 61 of oscillator assembly 10 and the top surface of the motherboard (not shown) on which the printed circuit board 12 and oscillator assembly 10 is adapted to be seated. The invention encompasses other cavity embodiments such as, for example, the embodiment where the interior of the printed circuit board 12 defines an isolated, totally enclosed pocket or cavity formed in the body of the printed circuit board 12 which is filled with air or a like insulative medium during the oscillator manufacturing process.

Figure 5:
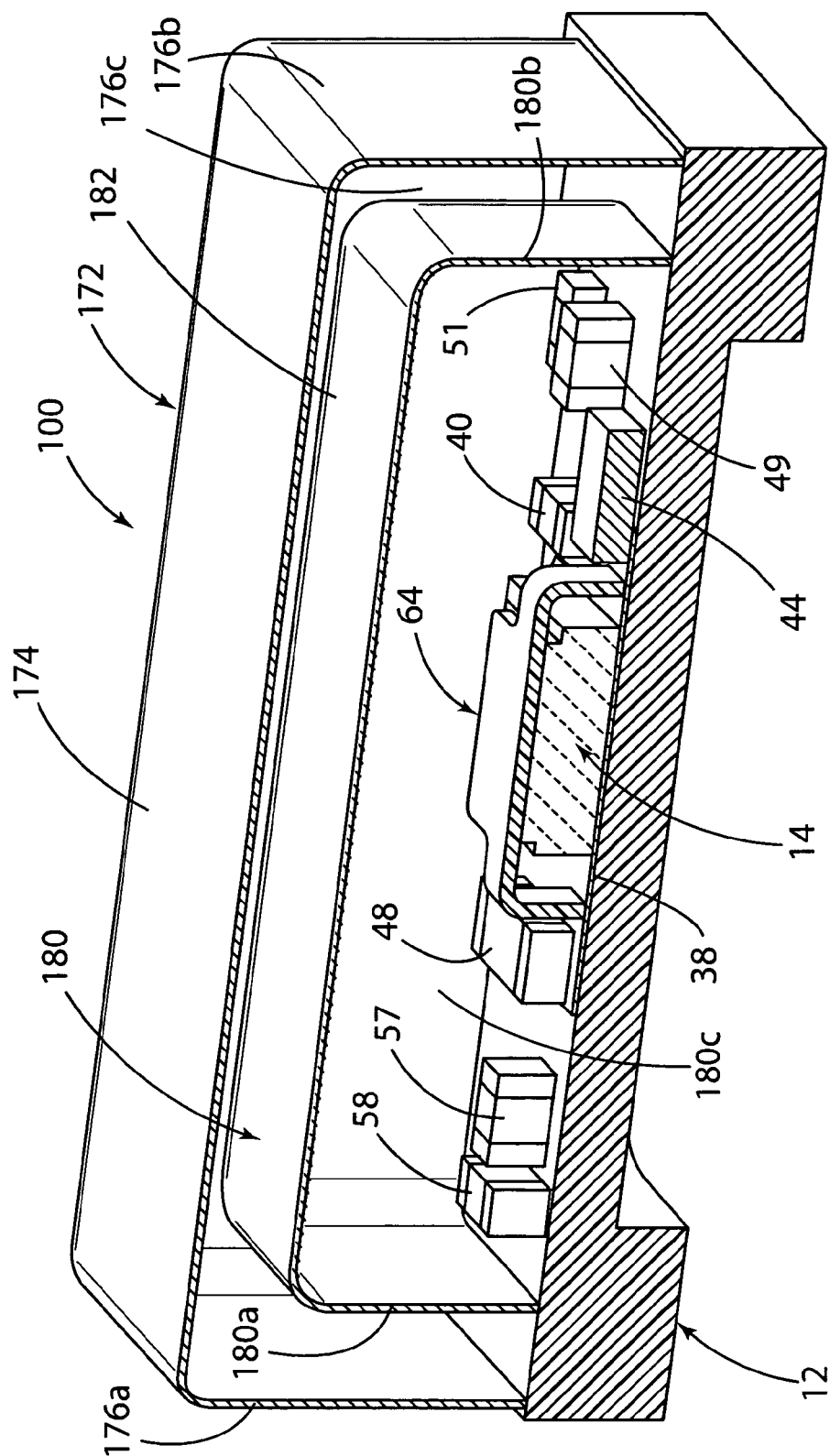
FIG. 5 is an enlarged simplified part perspective, part vertical cross-sectional view of an alternate embodiment of an ovenized crystal oscillator assembly in accordance with the present invention.

FIG. 5 shows another embodiment of an oscillator assembly 100 in accordance with the present invention which is similar to oscillator 10, and thus the description thereof is incorporated herein by reference, except that the oscillator assembly 100 additionally includes an inner lid 180 which includes a roof 182 and four downwardly depending walls, only three of which (180a, 180b, and 180c) are shown in FIG. 5, each defining a peripheral end face adapted to be seated on the top surface 13 of printed circuit board 12.

Lid 180 is preferably sized to cover all of the electrical components seated on top board surface 13 including at least the oscillator 14 and the temperature sensors 40 and 42 and thus defines an oven for at least the oscillator 14. Outer lid 172 covers the inner lid 180 and includes a roof 174 which is spaced from the roof 182 of inner lid 180 and further includes four downwardly depending walls, only three of which (176a, 176b, and 176c) are shown in FIG. 5, each defining a respective lower peripheral end face or edge seated on the top surface 13 of printed circuit board 12 adjacent the respective peripheral edges of printed circuit board 12. Both of the lids 172 and 180 differ from the lid 72 of FIG. 2 in that lids 172 and 180 are made of a suitable metal material having a thickness of about 0.2 mm.

While the invention has been taught with specific reference to the disclosed embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator assembly comprising:
   a substrate including a top surface and a bottom surface defining a cavity for an insulative medium;
   a pad of thermally conductive material on the top surface of the substrate;
   a temperature compensated crystal oscillator seated on the pad of thermally conductive material;
   a canopy seated on the pad and in contact with the temperature compensated crystal oscillator;
   at least one temperature sensor for sensing the temperature of the temperature compensated crystal oscillator;
   a heater at least partially seated on the pad for heating the pad and the temperature compensated crystal oscillator;
   a lid over the substrate defining an oven; and
   an integrated controller circuit seated on the top surface of the substrate and including at least one operational amplifier and at least one additional integrated element for providing sufficient power and/or generating heat, the integrated controller circuit being connected to the temperature sensor and the heater for controlling the heater in response to changes in temperature, wherein a portion of the integrated controller circuit is seated on the pad of thermally conductive material for transferring the heat generated by the integrated controller circuit to the pad of thermally conductive material and to the temperature compensated crystal oscillator seated on the pad of thermally conductive material.

2. The oscillator assembly of claim 1, further comprising additional heaters located on different sides of the temperature compensated crystal oscillator for heating different sides of the temperature compensated crystal oscillator.

3. An oscillator assembly adapted to be coupled to a motherboard and comprising:
   a substrate;
   a pad of thermally conductive material on the substrate;
   a crystal oscillator seated on the pad of thermally conductive material;
   at least one temperature sensor on the substrate in proximity to the oscillator for sensing the temperature of the crystal oscillator;
   a plurality of heaters on the substrate located on different sides of the oscillator and in contact with edges of the pad for heating the pad and the crystal oscillator;
   a cavity defined in the substrate below the pad of thermally conductive material and the plurality of heaters and defining a region of insulation between the substrate and the motherboard; and
   an integrated circuit mounted on the top surface of the substrate for controlling the plurality of heaters in response to changes in temperature wherein a portion of the integrated circuit is seated on the pad and integrates at least an operational amplifier and a transistor adapted to transfer heat to the pad and the oven.

4. An oscillator assembly, comprising at least:
   a substrate;
   a crystal oscillator on the substrate;
   at least one temperature sensor on the substrate in proximity to the crystal oscillator for sensing the temperature of the crystal oscillator;
   at least one heater on the substrate;
   an oven defined by a lid on the substrate which covers at least the crystal oscillator and the temperature sensor; and
   an integrated circuit controller on the substrate and connected to the temperature sensor and the heater for controlling the heater in response to changes in temperature, the integrated circuit controller integrating at least one operational amplifier and a transistor for providing sufficient power and/or generating heat, the integrated circuit controller further integrating a current limiting circuit adapted to limit excessive power when a short circuit occurs and a thermal overload circuit adapted to switch off the operational amplifier when the temperature in the oven exceeds a first set temperature.

5. The oscillator assembly of claim 4 further comprising a pad of thermally conductive material on the substrate and coupled to the heater, the pad being located beneath the crystal oscillator for heating the crystal oscillator.

6. The oscillator assembly of claim 5 further comprising a plurality of heaters mounted on the substrate and located on different sides of the crystal oscillator, the plurality of heaters being coupled to respective peripheral edge portions of the pad of thermally conductive material for heating the pad and the crystal oscillator.

7. The oscillator assembly of claim 4, further comprising a second lid covering the lid.

8. The oscillator assembly of claim 5, wherein the substrate defines a cavity with an insulative medium.

9. An oscillator assembly comprising:
   a substrate including a top surface and a bottom surface;
   a pad of thermally conductive material on the top surface of the substrate;
   an oscillator on the top surface of the substrate and seated on the pad of thermally conductive material;
   at least one heater on the substrate;
   an integrated controller circuit including at least one operational amplifier and at least one integrated element, wherein a portion of the integrated controller circuit is seated on the pad of thermally conductive material for transferring the heat generated by the integrated controller circuit to the pad of thermally conductive material and to the oscillator seated on the pad of thermally conductive material;
   a lid on the top surface of the substrate defining an interior oven; and
   a cavity defined in the bottom surface of the substrate, the cavity being located beneath the oscillator and the pad of thermally conductive material and defining a pocket for an insulative medium.

* * * * *